(12) United States Patent
Watanabe

(10) Patent No.: US 9,277,674 B2
(45) Date of Patent: Mar. 1, 2016

(54) ELECTRICAL PART FIXING STRUCTURE FOR HYBRID VEHICLES

(71) Applicant: SUZUKI MOTOR CORPORATION, Shizuoka (JP)

(72) Inventor: Koichiro Watanabe, Shizuoka (JP)

(73) Assignee: SUZUKI MOTOR CORPORATION, Shizuoka (JP)

( * ) Notice: Subject to any disclaimer, the term of this patent is extended or adjusted under 35 U.S.C. 154(b) by 302 days.

(21) Appl. No.: 13/777,254

(22) Filed: Feb. 26, 2013

(65) Prior Publication Data
US 2013/0235526 A1 Sep. 12, 2013

(30) Foreign Application Priority Data
Mar. 6, 2012 (JP) .................................. 2012-049198

(51) Int. Cl.
*B60K 13/04* (2006.01)
*B60K 1/00* (2006.01)
*H05K 7/20* (2006.01)
*B60L 11/12* (2006.01)

(52) U.S. Cl.
CPC .............. *H05K 7/20218* (2013.01); *B60K 1/00* (2013.01); *B60L 11/12* (2013.01); *B60K 13/04* (2013.01); *B60K 2001/003* (2013.01); *B60L 2240/525* (2013.01); *B60Y 2200/92* (2013.01); *Y02T 10/7005* (2013.01); *Y02T 10/7077* (2013.01)

(58) Field of Classification Search
CPC .............. B60K 1/04; B60K 2001/005; B60K 2001/0438; B60K 1/00; B60K 2001/0472; B60K 6/40; B60L 3/0046; Y02T 10/7077
See application file for complete search history.

(56) References Cited

U.S. PATENT DOCUMENTS

| 2,083,059 | A | * | 6/1937 | Fageol | 180/68.1 |
| 2,813,984 | A | * | 11/1957 | Dolecki et al. | 290/10 |
| 4,540,888 | A | * | 9/1985 | Drewry et al. | 290/1 R |
| 6,094,927 | A | * | 8/2000 | Anazawa et al. | 62/239 |
| 6,188,574 | B1 | * | 2/2001 | Anazawa | 361/695 |
| 8,251,169 | B2 | * | 8/2012 | Fujiwara | 180/68.1 |
| 8,701,809 | B2 | * | 4/2014 | Ikemoto et al. | 180/65.8 |
| 2006/0016633 | A1 | * | 1/2006 | Fujii et al. | 180/68.5 |
| 2009/0145676 | A1 | * | 6/2009 | Takasaki et al. | 180/65.1 |
| 2009/0186266 | A1 | * | 7/2009 | Nishino et al. | 429/120 |
| 2009/0197154 | A1 | * | 8/2009 | Takasaki et al. | 429/83 |
| 2010/0025132 | A1 | * | 2/2010 | Hill et al. | 180/65.29 |
| 2010/0294580 | A1 | * | 11/2010 | Kubota et al. | 180/68.1 |
| 2011/0068622 | A1 | * | 3/2011 | Ikeno et al. | 307/10.1 |

(Continued)

FOREIGN PATENT DOCUMENTS

| CN | 102029954 A | 4/2011 |
| JP | 2010-143408 A | 7/2010 |
| JP | 2011-98632 A | 5/2011 |

OTHER PUBLICATIONS

The First Office Action mailed Apr. 1, 2015 in corresponding Chinese Patent Application No. 201310068786.6 (with an English translation) (12 pages).

(Continued)

*Primary Examiner* — Paul N Dickson
*Assistant Examiner* — Bridget Avery
(74) *Attorney, Agent, or Firm* — Rothwell, Figg, Ernst & Manbeck, P.C.

(57) ABSTRACT

A battery charger is disposed above an exhaust pipe, and a junction box is disposed above the charger. The charger includes a cooler having a forced cooling function.

5 Claims, 4 Drawing Sheets

(56) References Cited

U.S. PATENT DOCUMENTS

| | | | |
|---|---|---|---|
| 2011/0232958 A1 | 9/2011 | Yamaguchi et al. | |
| 2011/0300427 A1* | 12/2011 | Iwasa et al. | 429/99 |
| 2012/0031689 A1* | 2/2012 | Kanno | 180/65.1 |
| 2012/0031690 A1* | 2/2012 | Kanno | 180/65.1 |
| 2012/0118655 A1* | 5/2012 | Ogihara et al. | 180/65.31 |
| 2012/0255799 A1* | 10/2012 | Kohler et al. | 180/65.245 |

OTHER PUBLICATIONS

Notice of Allowance mailed Oct. 29, 2015 in corresponding Chinese Patent Application No. 201310068786.6 (2 pages).

* cited by examiner

ELECTRICAL PART FIXING STRUCTURE FOR HYBRID VEHICLES

CROSS-REFERENCE TO RELATED APPLICATION

The present application claims the benefit of priority under 35 U.S.C.§119 to Japanese Patent Application No. 2012-049198, filed on Mar. 6, 2012, the entire content of which is incorporated herein by reference.

BACKGROUND OF THE INVENTION

1. Technical Field

The present invention relates to an electrical part fixing structure for hybrid vehicles, and particularly, to an electrical part fixing structure for hybrid vehicles including electrical parts disposed under a floor panel.

2. Background Art

Engine-mounted vehicles generally have a fuel tank and an exhaust pipe arranged under a floor panel. Hybrid vehicles have a traction motor mounted besides an engine, and associated electrical parts including a battery and an inverter. Such hybrid vehicles have power cable sets for electrical connections along a course between the battery and the inverter and a course between the inverter and the traction motor (refer to the PTL 1 below). In practical applications, such a power cable set has its constituent power cables divided in mid-course, as necessary, for the convenience in the fixing to a chassis. Such divided power cables are interconnected at a junction box being an electrical connection box. Hybrid vehicles are adapted to recharge the battery from an external power source. Such hybrid vehicles have a battery charger as an additional electrical part.

There are electrical part fixing structures for hybrid vehicles including such electrical parts disposed under a floor panel having arranged a fuel tank and an exhaust pipe. They pursue efficiencies in the spatial arrangement and the heat balance of their constituent parts.

CITATION LIST

Patent Literature

PTL1: JP2010-143408 A

SUMMARY OF THE INVENTION

There are spaces available for the electrical part arrangement, i.e., for fixing electrical parts under the floor panel having arranged a fuel tank and an exhaust pipe, subject to limitations by the fuel tank and the exhaust pipe. Those electrical parts include a junction box of a natural cooling type having no forced self-cooling function. Its heat balance is affected by the environment, and susceptive to influx of external heat. At regions having fixed electrical parts including the junction box, there are fluxes of heat transmitted from the exhaust pipe, of which quantities should thus be minimized. This matter also provides limitations to spaces for fixing electrical parts under the floor panel.

The present invention has been devised in view of the foregoing. It is an object of the present invention to provide an electrical part fixing structure for hybrid vehicles with an adaptation. This is to reduce quantities of heat transmitted from an exhaust pipe to regions having fixed electrical parts including a junction box, allowing for an efficient electrical part arrangement under a floor panel.

To achieve the object described, according to an aspect of the present invention, there is provided an electrical part fixing structure for hybrid vehicles including an exhaust pipe extending in a vehicle longitudinal direction, a battery charger, and a junction box adapted to interconnect divided power cables, under a floor panel. In the electrical part fixing structure, the battery charger is disposed above the exhaust pipe, the junction box is disposed above the battery charger, and a cooler is provided to the battery charger, the cooler having a forced cooling function.

DESCRIPTION OF EMBODIMENTS

There will be described an electrical part fixing structure for hybrid vehicles according to an embodiment of the present invention into details, with reference to the drawings.

It is noted that the drawings are illustrative, including differences from practices, such as those in magnitudes or proportions of dimensions or shapes. Drawings may include also differences in between such as those in ratios or relations of dimensions or shapes. It also is noted that drawings have coordinate systems defined by arrows as legends to identify vehicle longitudinal directions, transverse directions, and vertical directions, for the convenience in description.

(Configuration of Hybrid Vehicle)

Figure 1:
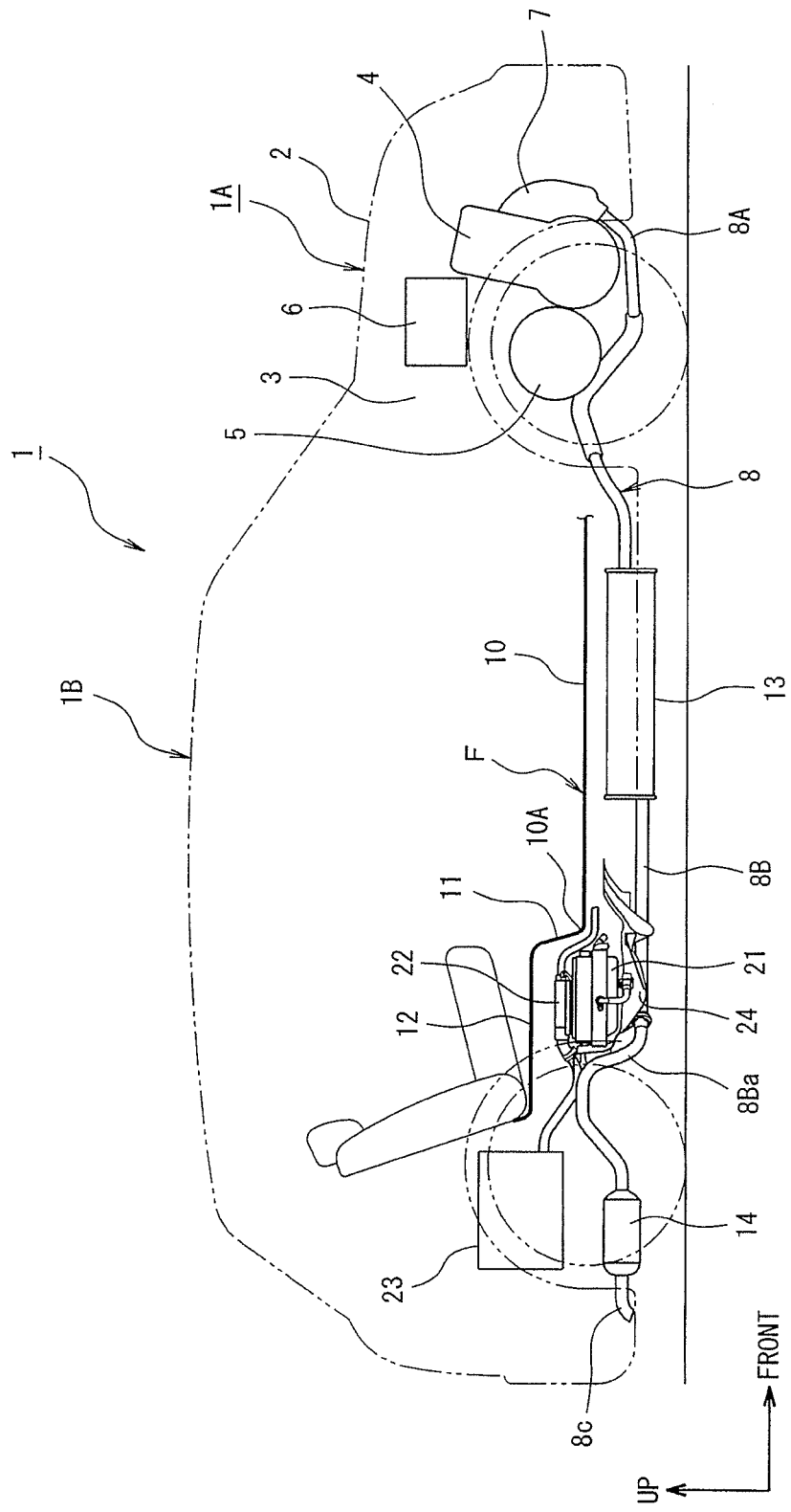
FIG. 1 is an elevation of vehicle illustrating an electrical part fixing structure for hybrid vehicles according to an embodiment of the present invention.
Figure 4:
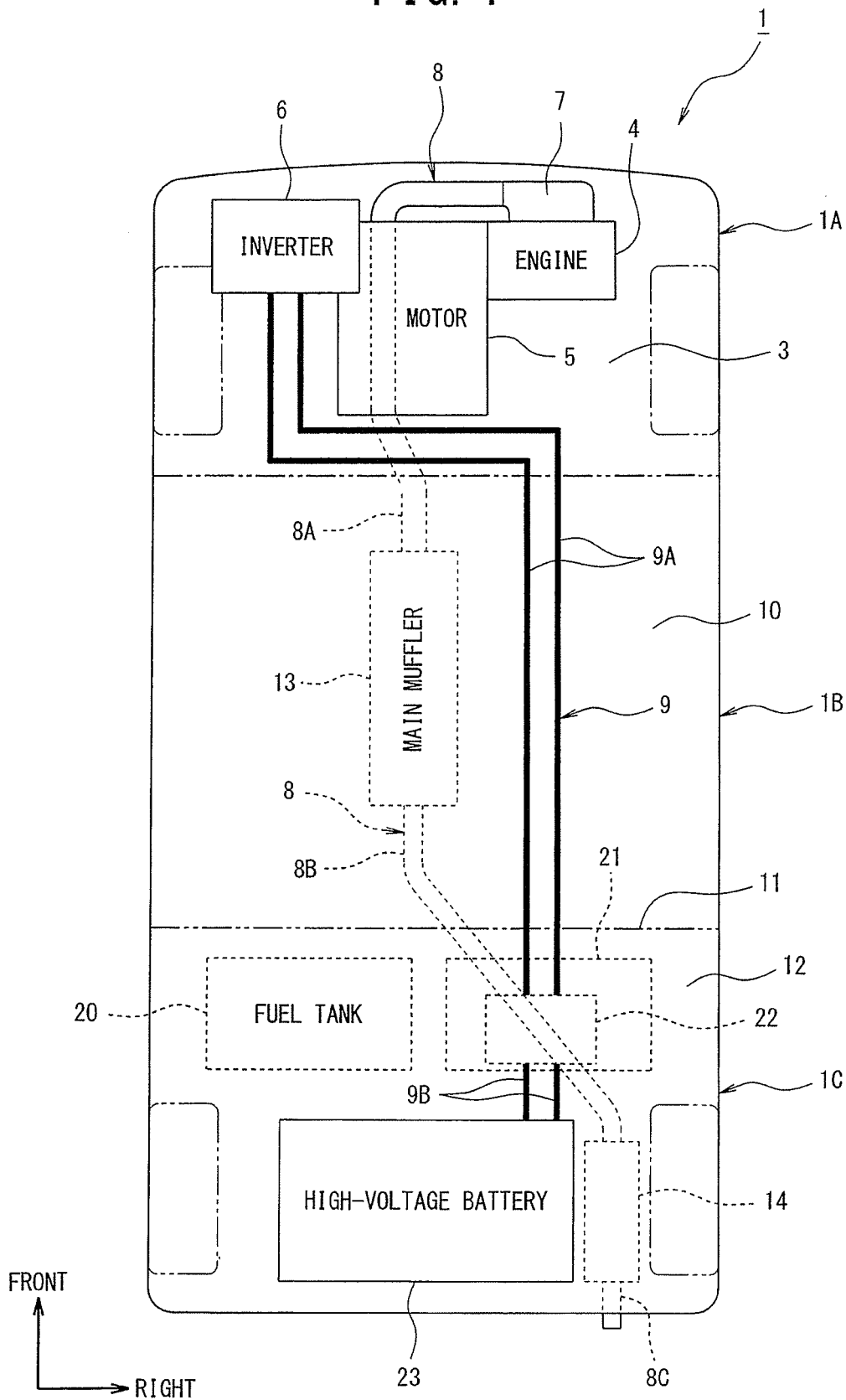
FIG. 4 is a plan of vehicle illustrating a layout of the electrical part fixing structure in FIG. 1.

FIG. 1 and FIG. 4 illustrate a hybrid vehicle 1 including an electrical part fixing structure according to an embodiment of the present invention. The hybrid vehicle 1 has at a front section 1A of the vehicle an engine hood 2 covering an engine room 3, where it has an engine 4, a traction motor 5, and an inverter 6 mounted inside, respectively. In the engine room 3, the engine 4 has an exhaust manifold 7 connected to an exhaust pipe 8. The motor 5 is electrically connected to the inverter 6, as necessary. The inverter 6 is connected to a high-voltage cable 9 being a power cable set.

As shown in FIG. 1, the hybrid vehicle 1 has in its lower part a floor panel F extending in a vehicle longitudinal direction. The floor panel F is made up as an integral member including a front floor panel 10 constituting a front floor in the vehicle 1, a vertical panel 11 constituting a riser of wall that is a floor step in the vehicle 1, and a rear floor panel 12 constituting a rear floor in the vehicle 1. In this embodiment, the front floor panel 10 is continued at its rear end to the vertical panel 11 rising therefrom, and the vertical panel 11 is continued at its top end to the rear floor panel 12 extending therefrom vehicle-longitudinally rearward substantially in the horizontal direction. The rear floor panel 12 is set in position at a level higher than the front floor panel 10 by a step height of the vertical panel 11. Along such a configuration of the floor panel F, the exhaust pipe 8 is installed. The exhaust pipe 8 comes out of the engine room 3, and appears under the floor panel F as it is lead downward in front of a front edge (see FIG. 4) of the front floor panel 10. Then it extends substantially vehicle-longitudinally rearward along downsides of the front and rear floor panels 10 and 12, all the way up to a position near the tail end of the hybrid vehicle 1, where it exhausts.

FIG. 4 shows a layout of equipment including a fuel tank 20, a battery charger 21, a junction box 22, and a high-voltage battery 23. The fuel tank 20 is installed in a vehicle-transversely left mount area under a front part of the rear floor panel 12 that is free from interferences with the exhaust pipe 8. The charger 21 is installed in a vehicle-transversely right mount area under the front part of the rear floor panel 12 that is free from interferences with the fuel tank 20. The junction box 22 is installed in a space between the charger 21 and a region of the panel above the charger 21, the junction box 22 overlapping the charger 21 in the plan. The battery 23 is installed in a mount area on the upside of a rear part of the rear floor panel 12. In the example shown in FIG. 4, the exhaust pipe 8 passes under the charger 21, having the charger 21 disposed thereabove. The exhaust pipe 8 is spaced from the charger 21 as in FIG. 1, there being a heat-shielding cover 24 interposed in between.

(Exhaust Pipe)

In the example shown in FIG. 1, the exhaust pipe 8 is composed of a front exhaust unit 8A, a main muffler 13, a central exhaust unit 8B, a sub-muffler 14, and a rear exhaust unit 8C connected in series. The front exhaust unit 8A has a catalytic converter at the front end. The main muffler 13 is installed between the front exhaust unit 8A and the central exhaust unit 8B. The sub-muffler 14 is installed between the central exhaust unit 8B and the rear exhaust unit 8C. The exhaust pipe 8 is supported through muffler mounts relative to a chassis.

Figure 2:
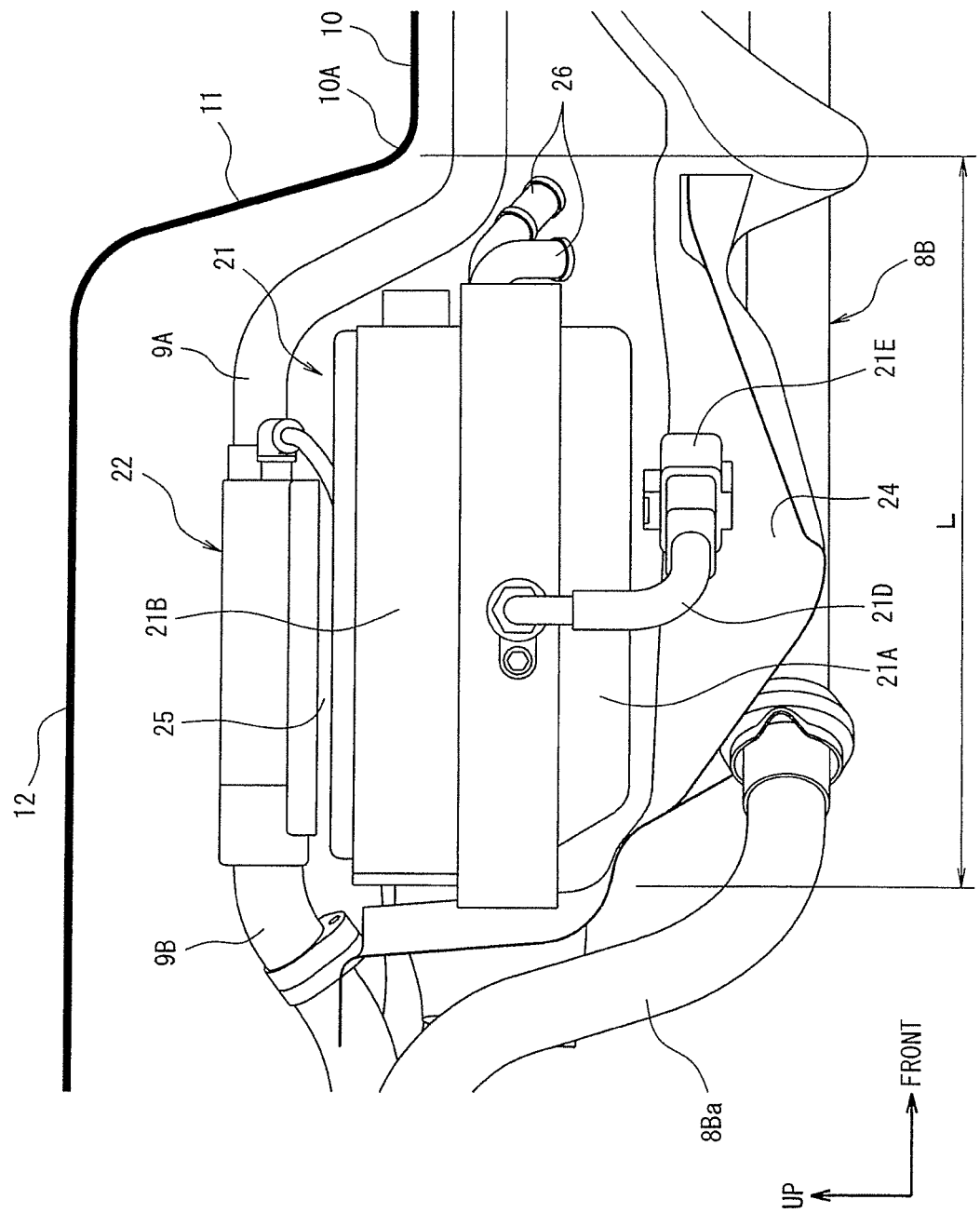
FIG. 2 is a detailed view of an essential portion of the electrical part fixing structure in FIG. 1.

The central exhaust unit 8B vehicle-longitudinally extends between an intermediate part of the front floor panel 10 and an intermediate part of the rear floor panel 12. As shown in FIG. 2, the central exhaust unit 8B substantially horizontally rearward extends from a position under the intermediate part of the front floor panel 10 to a position spaced by a prescribed distance L from a position where the front floor panel 10 has its rear edge 10A. In the plan in FIG. 4, the central exhaust unit 8B is flexed vehicle-transversely rightward as it extends vehicle-longitudinally rearward. In other words, the central exhaust unit 8B is lead obliquely rightward as it extends rearward from a position behind the main muffler 13. The central exhaust unit 8B has a riser 8Ba as a curved tube rising at the position spaced by the distance L relative to the rear edge 10A of the front floor panel 10. In the elevation in FIG. 1, the riser 8Ba is followed by a successive tubular part of the central exhaust unit 8B, which is curved obliquely downward as it extends vehicle-longitudinally rearward, for connection to a front part of the sub-muffler 14. The sub-muffler 14 is connected at its rear part to the rear exhaust unit 8C.

(Fuel Tank)

In the example shown in FIG. 4, the fuel tank 20 is installed in one of mount areas residing under the rear floor panel 12 behind the vertical panel 11, that extends vehicle-transversely leftward of the central exhaust unit 8B. This mount area is free from interferences with the central exhaust unit 8B. In addition, the central exhaust unit 8B is flexed rightward, affording for the fuel tank 20 to have a secured capacity, as necessary.

(Heat-Shielding Cover)

Figure 3:
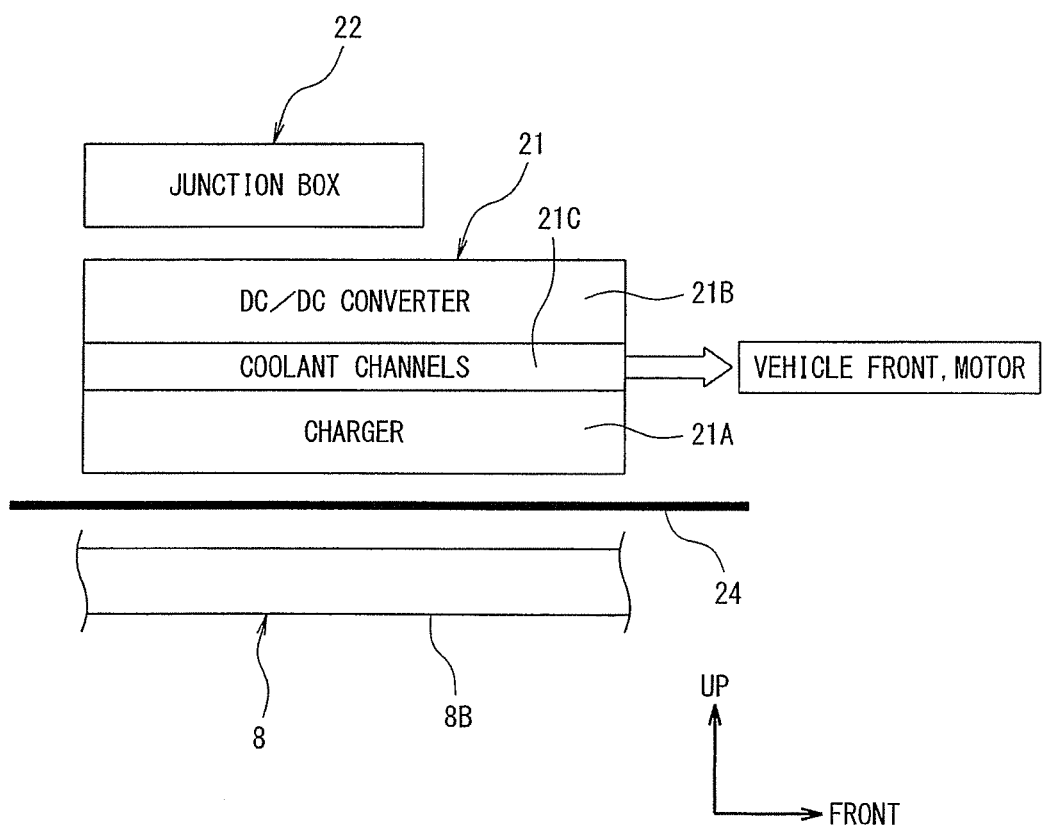
FIG. 3 is a block diagram showing a configuration of an essential portion of the electrical part fixing structure in FIG. 1.

As shown in FIG. 2 and FIG. 3, the heat-shielding cover 24 is interposed in position between the central exhaust unit 8B and the charger 21. The heat-shielding cover 24 has an effective shield area preset to be equivalent to or larger than an apparent area of a bottom of the charger 21, as necessary, in order for outside surfaces including the bottom of the charger 21 not to directly face upside surface regions of the central exhaust unit 8B. The heat-shielding cover 24 is formed as a member strong or rigid enough to endure impacts of foreign matters such as bounced pebbles from below, preventing them from colliding against the charger 21. For the member, materials used may involve a metal, heat-resistant resin, etc. The heat-shielding cover 24 has a function of shielding heat radiation from the exhaust pipe 8 (in particular, from the central exhaust unit 8B) to a space including the charger 21 and regions thereabove.

(Battery Charger)

In the example shown in FIG. 2 and FIG. 3, the charger 21 includes a body of charger 21A, a DC/DC converter 21B integrally provided on the charger body 21A, and a network of coolant channels 21C (see FIG. 3) formed in the charger to work as a cooler having a forced cooling function. In this example, the charger 21 has a water-cooling cooler. The charger body 21A is connected to a charging cable 21D. As shown in FIG. 2, the charging cable 21D has a power receiving connector 21E (for instance, a receptacle) attached to the distal end. The power receiving connector 21E is accommodated in an open-close operable power supply port provided in a vehicle body panel. The power receiving connector 21E is adapted to mate with a power supply connector (for instance, a power supply plug), to thereby supply power through the charging cable 21D to the charger body 21A.

The DC/DC converter 21B is adapted to convert a high voltage from the battery 23 to a low voltage, to supply power to loads in a low-voltage system, working to charge a battery of 12V, as necessary. The coolant channel network 21C shown in FIG. 3 may have channels formed in regions between the charger body 21A and the DC/DC converter 21B. In the example shown in FIG. 2, the charger body 21A has, at the vehicle-longitudinally front side, connections to coolant lines 26 communicating with the coolant channel network 21C. The coolant lines 26 extend into the engine room 3 at the vehicle front section 1A, where they are connected to a cooling system at the motor 5 end.

(Junction Box)

In the example shown in FIG. 2 and FIG. 4, the junction box 22 is disposed in a fixing space above the charger 21, and fixed to a chassis end with a spacing set up as necessary relative to the charger 21. In the plan in FIG. 4, the junction box 22 overlaps the charger 21, residing within outside lines of the charger 21. In other words, the junction box 22 in the plan view is arranged to overlap a region occupied by the charger 21, inside the region. The high-voltage cable 9 is composed of power cables, which are divided into front power cables 9A and 9A to be connected to the inverter 6 and rear power cables 9B and 9B to be connected to the battery 23. Among divided power cables 9A, 9A and 9B, 9B, associated ones 9A, 9B and 9A, 9B are interconnected in the junction box 22, respectively. The junction box 22 may comply with the law for internal isolation for use to interconnect branches of wiring harness arranged in the vehicle.

Description is now made of functions of the electrical part fixing structure described with respect to the hybrid vehicle 1. In the hybrid vehicle 1, the electrical part fixing structure includes a battery charger 21 disposed above a central exhaust unit 8B, and a junction box 22 disposed above the charger 21, thus permitting the charger 21 to effectively reduce quantities of heat transmitted from the central exhaust unit 8B to the junction box 22, preventing undue heat transmission.

Moreover, it includes a heat-shielding cover 24 interposed between the central exhaust unit 8B and the charger 21, thus permitting the heat-shielding cover 24 to effectively shield heat radiation from the central exhaust unit 8B to the charger 21, preventing undue heat transmission. Still more, it includes the heat-shielding cover 24 being disposed between the central exhaust unit 8B and the charger 21 disposed thereabove, in combination with the junction box 22 being disposed above the charger 21, thus permitting the heat-shielding cover 24 to be employed as a common heat-shielding member for the charger 21 and the junction box 22, affording to do without provision of a dedicated heat-shielding member for the junction box 22. In other words, it is unnecessary to individually cover both charger 21 and junction box 22 with heat-shielding members. This affords to cancel part of spaces that might be otherwise required to individually cover both charger 21 and junction box 22 with heat-shielding members, saving it for other use. Provision of the heat-shielding cover 24 thus permits the more efficient arrangement of electrical parts under a rear floor panel 12. Yet more, the heat-shielding cover 24 can work to protect the charger 21 and the junction box 22 against foreign matters such as bounced pebbles from below. Further, the charger 21 is provided with a network of coolant channels 21C as a water-cooled cooler having a forced cooling function, affording to control the charger 21 to hold adequate temperatures depending on variations in quantity of heat dissipated from the central exhaust unit 8B.

In the example shown in FIG. 2, the charger 21 and the junction box 22 are arranged in a vertically layered manner within one of spaces including mount areas residing behind a vertical panel 11, that is, one of spaces within a spacing between a rear edge 10A of a front floor panel 10 connected to a lower edge of the vertical panel 11 and a location vehicle-longitudinally rearward spaced therefrom by a prescribed distance L. There are spaces residing under a rear floor panel 12 behind the vertical panel 11 that have, as an available benefit relative to spaces under the front floor panel 10, an additional height dimension corresponding to a level difference defined by and between the front floor panel 10 and the rear floor panel 12, with the vertical panel 11 in between, whereby those spaces are vertically extended. In the hybrid vehicle 1, the electrical part fixing structure makes use of such a space behind the vertical panel 11, to efficiently arrange the charger 21 covered with a heat shield being the cover 24 and the junction box 22, in combination, above the central exhaust unit 8B. Such being the case, in the hybrid vehicle 1, the electrical part fixing structure is adapted to efficiently arrange electrical parts including the charger 21 and the junction box 22 in a space or spaces under the rear floor panel 12, reducing quantities of heat transmitted to the electrical parts, allowing for promoted heat balances of the electrical parts.

Embodiments of the present invention have been described, including discussions and drawings constituting part of the disclosure, which should be construed as illustrative, not restrictive to the invention. There will be various substitute embodiments, examples, and application techniques made apparent to artisan from the disclosure. For instance, an example described employs a water-cooled charger 21, which may well be substituted by an air-cooled charger or a charger to be cooled with Peltier elements.

Moreover, an example described includes an inverter 6 disposed in a front section of a hybrid vehicle 1, and a high-voltage battery 23 disposed in a rear section of the hybrid vehicle 1, while such an electrical part layout is in no way restrictive to the present invention. Further, an example described includes a junction box 22 disposed within a region of a fixing area occupied by a charger 21 in a plan view thereof, while the junction box 22 disposed may well be accommodated within a space above a heat-shielding cover 24, with an outside line thereof in the plan view deviating in part outside the occupied region.

As will be seen from the foregoing description, according to the present invention, there is an electrical part fixing structure for hybrid vehicles adapted to reduce quantities of heat transmitted from an exhaust pipe to electrical parts including a junction box and a battery charger, preventing undue heat transmission, allowing for promoted efficiencies in the arrangement and the heat balance of electrical parts under a floor panel.

The present invention has effective applications to hybrid vehicles including electrical parts disposed under a floor panel.

What is claimed is:

1. A hybrid vehicle comprising:
   a floor panel;
   an engine having an exhaust pipe conveying exhaust gas from the engine and extending in a longitudinal direction of the vehicle under the floor panel;
   a traction motor;
   a high-voltage battery for the traction motor;
   an inverter connected to the traction motor;
   a junction box under the floor panel, the junction box being configured to interconnect divided power cables to provide an electric connection between the high-voltage battery and the inverter; and
   a battery charger under the floor panel, the battery charger including a cooler,
   the battery charger being disposed above the exhaust pipe and under the junction box such that the battery charger is arranged to reduce transmission of heat from the exhaust pipe to the junction box.

2. The hybrid vehicle according to claim 1, further comprising a heat-shielding cover disposed under the floor panel and between the exhaust pipe and the battery charger such that the head-shielding cover is arranged to reduce transmission of heat from the exhaust pipe to the battery charger.

3. The hybrid vehicle according to claim 1, wherein:
   the floor panel includes a front floor panel extending vehicle-longitudinally forward, a vertical panel rising from a rear edge of the front floor panel, and a rear floor panel extending vehicle-longitudinally rearward from an upper edge of the vehicle panel, and
   the battery charger and the junction box are disposed in a space extending vehicle-longitudinally rearward of the vertical panel.

4. The hybrid vehicle according to claim 1, wherein the cooler includes coolant channels formed in the battery charger to cool the battery charger with coolant passing through the coolant channels.

5. The hybrid vehicle according to claim 2, wherein:
   the floor panel includes a front floor panel extending vehicle-longitudinally forward, a vertical panel rising from a rear edge of the front floor panel, and a rear floor panel extending vehicle-longitudinally rearward from an upper edge of the vehicle panel, and
   the battery charger and the junction box are disposed in a space extending vehicle-longitudinally rearward of the vertical panel.

* * * * *